(12) United States Patent
Sheen

(10) Patent No.: US 8,363,772 B2
(45) Date of Patent: Jan. 29, 2013

(54) METHODS FOR ELIMINATING PHASE DISTORTION IN SIGNALS

(75) Inventor: Ruey-Bin Sheen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1146 days.

(21) Appl. No.: 11/807,521

(22) Filed: May 29, 2007

(65) Prior Publication Data

US 2008/0297200 A1 Dec. 4, 2008

(51) Int. Cl.
    H04L 7/00 (2006.01)
    H04L 25/00 (2006.01)
    H04L 25/40 (2006.01)
(52) U.S. Cl. ........................................... 375/371
(58) Field of Classification Search .................. 375/130, 375/316, 326, 335, 360, 371, 373, 375, 376; 327/12, 112, 152, 153, 156, 159, 161
    See application file for complete search history.

(56) References Cited

U.S. PATENT DOCUMENTS

| | | | | |
|---|---|---|---|---|
| 6,556,640 B1* | 4/2003 | Baba | | 375/376 |
| 2001/0022824 A1* | 9/2001 | Araki | | 375/360 |
| 2002/0017936 A1* | 2/2002 | Stark et al. | | 327/175 |
| 2002/0163986 A1* | 11/2002 | Harrison | | 375/374 |
| 2003/0107415 A1* | 6/2003 | Nguyen | | 327/115 |
| 2003/0174023 A1* | 9/2003 | Miyasita | | 330/254 |
| 2005/0116750 A1* | 6/2005 | Tsai | | 327/156 |
| 2006/0116839 A1* | 6/2006 | Zumkehr et al. | | 702/106 |
| 2007/0229124 A1* | 10/2007 | Tokuno | | 327/112 |

* cited by examiner

*Primary Examiner* — David C. Payne
*Assistant Examiner* — Syed Haider
(74) *Attorney, Agent, or Firm* — Slater & Matsil, L.L.P.

(57) ABSTRACT

A circuit for reducing phase distortion of a first signal and a second signal is provided, wherein the first and the second signals are complementary. The circuit includes a detecting circuit for detecting a first edge of the first signal and a second edge of the second signal, wherein the second edge immediately follows the first edge and is in a same direction as the first edge; an output node; and a signal regenerator connected to the detecting circuit and the output node. The signal regenerator is configured to generate an output signal having an additional first edge and an additional second edge. The additional first edge and the additional second edge are opposite edges substantially aligned to the first edge and the second edge, respectively. The additional first edge and the additional second edge are immediate neighboring edges.

11 Claims, 4 Drawing Sheets

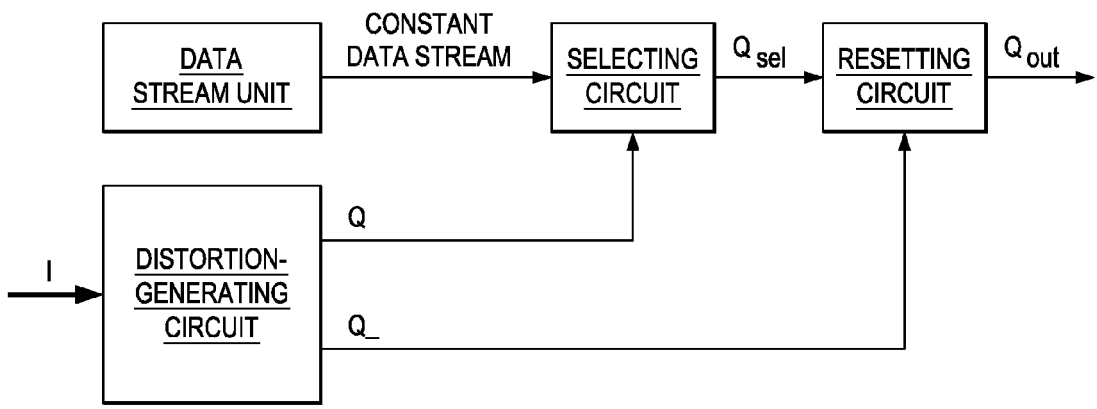
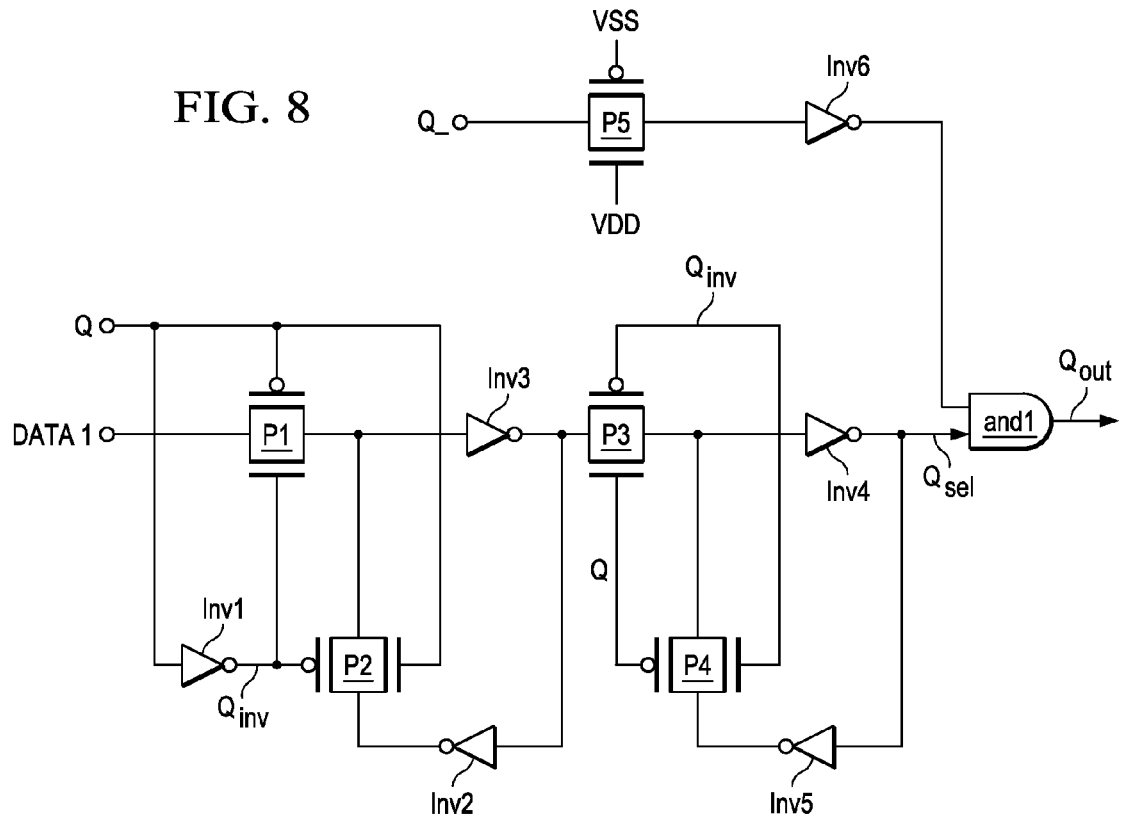

METHODS FOR ELIMINATING PHASE DISTORTION IN SIGNALS

TECHNICAL FIELD

This invention relates generally to signal transmissions, and more particularly to eliminating signal phase distortions generated in the signal transmissions.

BACKGROUND

In data communication systems, signals may be degraded by various sources, such as level shifters and other signal propagation paths. Signal degradation has various forms, among which, phase distortion is one of the most commonly observed. FIG. 1 illustrates an exemplary phase distortion of a signal. After an original signal is passed into a phase distortion path, a translated signal is generated. The original signal has a period $T_{org}$, and the translated signal has a period $T_{trl}$. Typically, the periods $T_{org}$ and $T_{trl}$ are measured corresponding to the mid-points of the signal transition edges. Due to mismatched rising delay $T_{dr}$ and falling delay $T_{df}$, periods $T_{trl}$ and $T_{per}$ are different, hence the phase distortion. Typically, phase distortion PD can be expressed as:

$$PD = |T_{org} - T_{trl}| T_{org} \qquad [\text{Eq. 1}]$$

For advanced circuits, such as high-speed applications, the phase distortion limits the operation speeds of the communication systems. Efforts have been taken to reduce the phase distortion. For example, complementary metal-oxide-semiconductor (CMOS) inverters with extreme P/N ratios have been designed, so that the periods of the signal are taken at points different from the mid-points of the transition edges. However, this solution suffers from process variations, voltage variations and temperature variations.

Additionally, circuits using current-mode amplification have been designed, wherein currents, instead of voltages, are used to represent signals. This type of circuit has high power consumption, since high currents are needed to represent high voltages.

The duty cycle correction mechanism has also been introduced, which can restore clock signals. However, this mechanism is not suitable for data communications, in which the signals are random, instead of having repeated patterns. In addition, circuits using the duty cycle connection mechanism also suffer from high power consumption.

Accordingly, what is needed in the art is a method for eliminating the phase distortion of signals while at the same time overcoming the deficiencies of the prior art.

SUMMARY OF THE INVENTION

In accordance with one aspect of the present invention, a circuit for reducing phase distortion of a first signal and a second signal is provided, wherein the first and the second signals are complementary. The circuit includes a detecting circuit for detecting a first edge of the first signal and a second edge of the second signal, wherein the second edge immediately follows the first edge and is in a same direction as the first edge; an output node; and a signal regenerator connected to the detecting circuit and the output node. The signal regenerator is configured to generate an output signal having an additional first edge and an additional second edge. The additional first edge and the additional second edge are opposite edges substantially aligned to the first edge and the second edge, respectively. The additional first edge and the additional second edge are immediate neighboring edges.

In accordance with another aspect of the present invention, the circuit includes a constant data stream unit; a selecting circuit and a resetting circuit. The selecting circuit includes a first input node connected to the constant data stream unit, wherein the data stream unit is configured to provide a constant data stream selected from the group consisting essentially of a data 0 stream and a data 1 stream; a second input node connected the first signal; and a first output node. The resetting circuit includes a third input node connected to the first output node of the selecting circuit; a fourth input node connected to the second signal; and a second output node.

In accordance with yet another aspect of the present invention, a method for reducing phase distortion in a first signal and a second signal is provided, wherein the first and the second signals are complementary. The method includes detecting a first edge of the first signal; detecting a second edge of the second signal, wherein the first and the second edges are in a same direction, and wherein the second edge immediately follows the first edge; and generating an output signal having a third and a fourth edge substantially aligned with the first and the second edges, respectively, wherein the third and the fourth edges are opposite edges immediately next to each other.

In accordance with yet another aspect of the present invention, the method includes providing a constant data stream selected from the group consisting essentially of a data 0 stream and a data 1 stream; selecting the constant data stream to form an output signal, wherein the step of selecting is performed in an interval between a first edge of the first signal and a second edge of the second signal, and wherein the first edge and the second edge are in a same direction; and resetting the output signal to a signal level opposite to a signal level of the constant data stream, wherein the step of resetting starts from a later edge in the first and the second edges.

The embodiments of the present invention are capable of substantially eliminating the phase distortion. Data signals having random patterns can be restored. Furthermore, power consumption does not increased.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 illustrates a block diagram of a circuit for implementing the circuit diagram shown in FIG. 5; and FIG. 8 illustrates a circuit diagram implementing the block diagram shown in FIG. 7.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for eliminating phase distortions in signal communications is provided. The variations of the embodiments of the present invention are discussed. Throughout the various views and illustrative embodiments of the present invention, like reference numbers are used to designate like elements.

Figure 1:
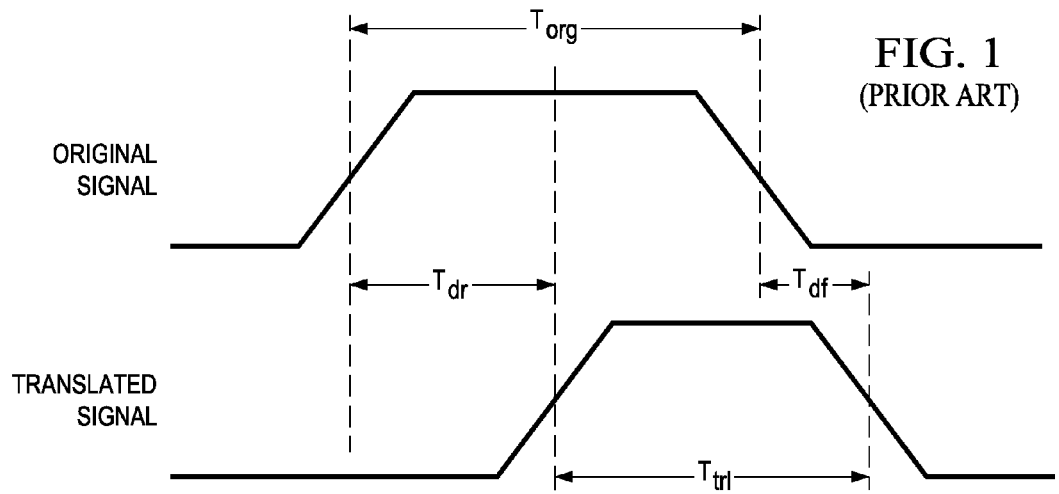
FIG. 1 illustrates a phase distortion occurrence when a translated signal is generated from an original signal.
Figure 2:
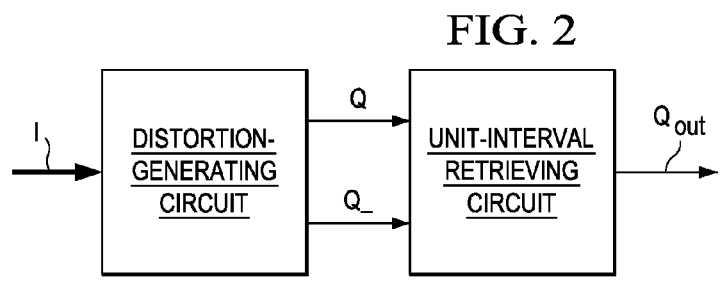
FIG. 2 illustrates a block diagram of an embodiment of the present invention, wherein a restored output signal substantially free from phase distortion is generated from a pair of complementary output signals.

FIG. 2 illustrates a block diagram of an embodiment of the present invention. After input signal I passes through a distortion-generating circuit, a pair of complementary output signals Q and Q_ are generated. It is appreciated that the term "distortion-generating circuit" does not indicate that the circuit is for generating phase distortions. Rather, distortion is an undesirable, and often inevitable, effect of the distortion-generating circuit. Complementary output signals Q and Q_ are distorted relative to the input signal I. To restore the phase of the distorted output signals, the complementary output signals Q and Q_ are input into an unit-interval retrieving circuit, which generates a restored output signal $Q_{out}$ from the complementary output signals Q and Q_. Preferably, the restored output signal $Q_{out}$ has a unit period, which is substantially the same as the unit period in the input signal I. Throughout the description, the terms "unit interval" and "period" are interchangeably used. The unit-interval retrieving circuit has the function of detecting rising and falling edges of the complementary output signals Q and Q_, and regenerating the restored output signal $Q_{out}$ based on the detected rising and falling edges. Please note that throughout the description, the input signal and the output signal are denoted as I and Q, and their complementary signals are denoted as I_ and Q_, respectively. However, one skilled in the art will realize that the complementary notations I and I_, and Q and Q_ are relative to each other, and can be exchanged.

Figure 3:
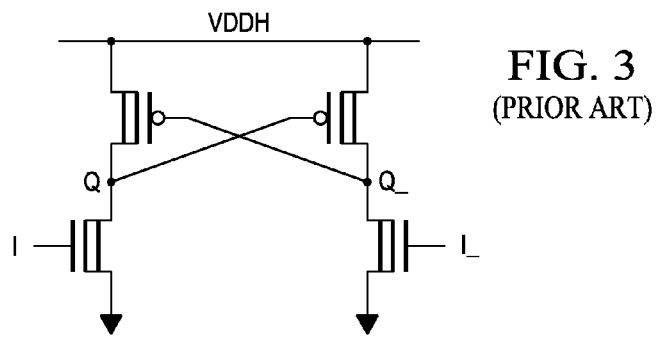
FIG. 3 illustrates a level shifter for generating a pair of complementary output signals, which may have a phase distortion.

FIG. 3 illustrates an exemplary distortion-generating circuit, which is a well-known level shifter. As is known in the art, due to different operation voltages between different functional circuits, signals may have different amplitudes. For example, input/output circuits typically have higher operation voltages than core circuits, and so are the magnitudes of the signals handled by the functional circuits. Accordingly, when a signal is transferred between a core circuit and an input/output circuit, the signal needs to be level-shifted to suit the receiving core circuit or input/output circuit. In the level-shifter shown in FIG. 3, complementary input signals I and I_, which have a smaller amplitude, is level shifted to output signals Q and Q_ with a higher magnitude (VDDH). The complementary output signals Q and Q_ are generated at a pair of complementary nodes.

Figure 4:
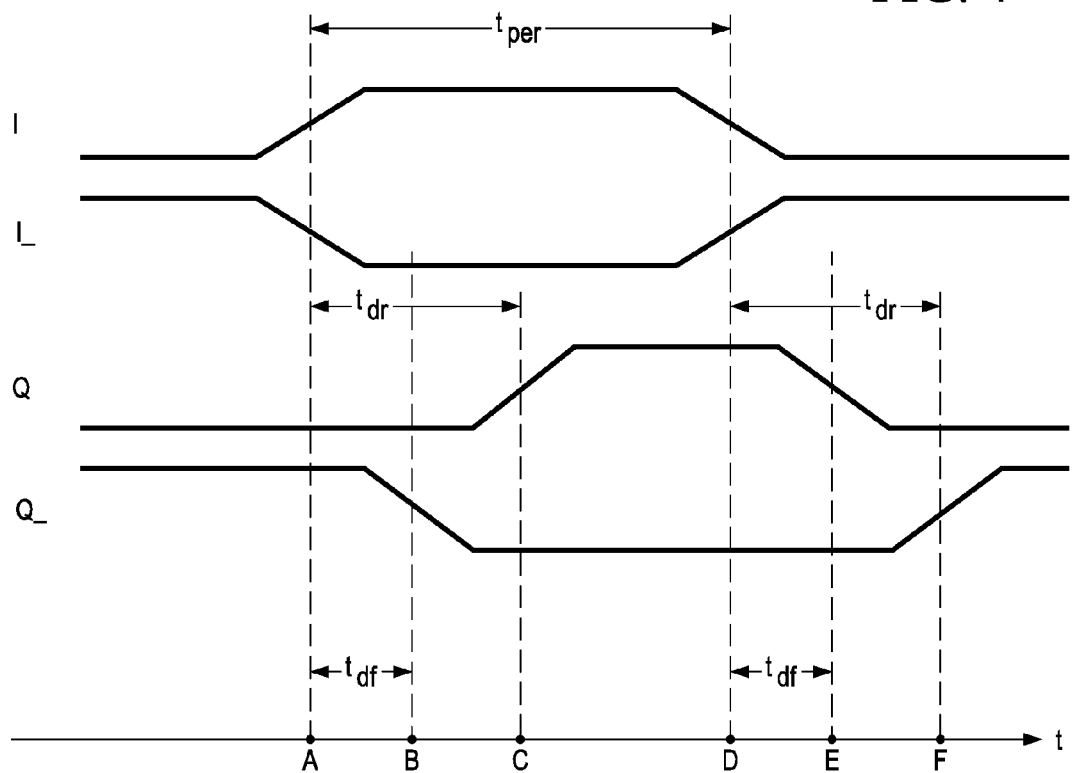
FIG. 4 illustrates a time sequence diagram of input and output signals.

FIG. 4 schematically illustrates exemplary time sequences of input signals I, I_ and output signals Q and Q_, wherein the horizontal direction indicates time t. The illustrated exemplary input signal I has a low voltage (data 0) in the beginning, and then the signal transmits to a high voltage (data 1), followed by falling back to data 0. Accordingly, signal I has a unit transition between time points A and D. Assuming the rising point is at time t(A), which is the mid-point of the rising edge of signal I, and further assuming the falling point is at time t(D), which is the mid-point of the falling edge of signal I, the period (or the unit interval) $T_{per}$ is t(D)-t(A). Similarly, the inverted input signal I_ has period $T_{per}$. One skilled in the art will realize that the rising and falling points may be defined at different levels of the respective rising and falling edges rather than the mid-points.

The transitions of the complementary output signals Q and Q_ follow the transitions of input signals I and I_. However, due to the delay caused by the distortion-generating circuit (refer to FIG. 2), the rising mid-point of output signal Q is at time t(C), and the falling mid-point of output signal Q is at time t(E). The falling mid-point of complementary output signal Q_ is at time t(B), and the rising mid-point of complementary output signal Q_ is at time t(F). Relative to the rising mid-point t(A), the rising delay of complementary output signal Q is $t_{dr}$, and the falling delay of output signal Q_ is $t_{df}$. Similarly, relative to the falling mid-point t(D) of input signal I, the falling delay of complementary output signal Q is $t_{df}$, and the rising delay of output signal Q_ is $t_{dr}$. Therefore, the following equations can be derived:

$$t(B)=t(A)+t_{df} \tag{Eq. 2}$$

$$t(C)=t(A)+t_{dr} \tag{Eq. 3}$$

$$t(D)=t(A)+t_{per} \tag{Eq. 4}$$

$$t(E)=t(A)+t_{per}+t_{df} \tag{Eq. 5}$$

$$t(F)=t(A)+t_{per}+t_{dr} \tag{Eq. 6}$$

Accordingly, a time difference between time t(E) and time t(B) is:

$$t(E)-t(B)=(t(A)+t_{per}+t_{df})-(t(A)+t_{df})=t_{per} \tag{Eq. 7}$$

Therefore, the original period $t_{per}$ of the input signals I and I_ may be retrieved by subtracting the falling mid-point t(E) of signal Q by the falling mid-point t(B) of the complementary signal Q_, and hence in the correspondingly generated output signal, the phase distortion is substantially eliminated.

Similarly, a time difference between time t(F) and time t(C) is:

$$t(F)-t(C)=(t(A)+t_{per}+t_{dr})-(t(A)+t_{dr})=t_{per} \tag{Eq. 8}$$

The original period $t_{per}$ (and hence the original phase) of the input signal I may be retrieved by subtracting the rising mid-point time t(F) of complementary signal Q_ by the rising mid-point time t(C) of signal Q, and hence in the correspondingly generated output signal, the phase distortion is substantially eliminated. Please note edges corresponding to time points F and C are in a same direction (both are rising edges), and edges corresponding to time points E and B are in a same direction (both are falling edges).

Figure 5:
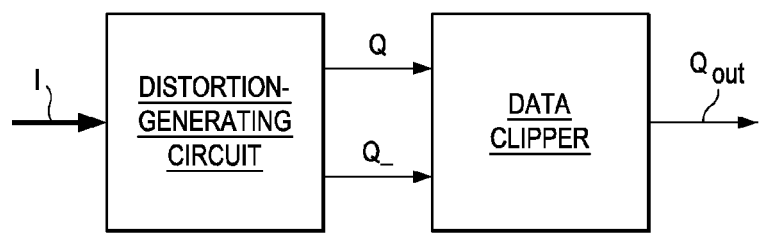
FIG. 5 illustrates a block diagram of a circuit for implementing the circuit diagram shown in FIG. 2.

FIG. 5 illustrates a block diagram of a circuit for implementing the circuit diagram shown in FIG. 2, wherein the phase retrieving (also referred to as unit-interval retrieving) circuit includes a data clipper. The data clipper uses the complementary output signals Q and Q_ to find the falling mid-point t(E) of signal Q and the falling mid-point t(B) of the complementary signal Q_, and regenerates a restored output signal $Q_{out}$ substantially free from phase distortion. Alternatively, The data clipper uses the complementary output signals Q and Q_ to find the rising mid-point t(F) of the complementary signal Q_ and the rising mid-point t(C) of signal Q, and regenerates the restored output signal $Q_{out}$. In an embodiment, regenerating the output signal is performed by clipping a data 1 stream, which is a constant data stream having a high voltage level, using the rising and falling mid-points.

Figure 6A:
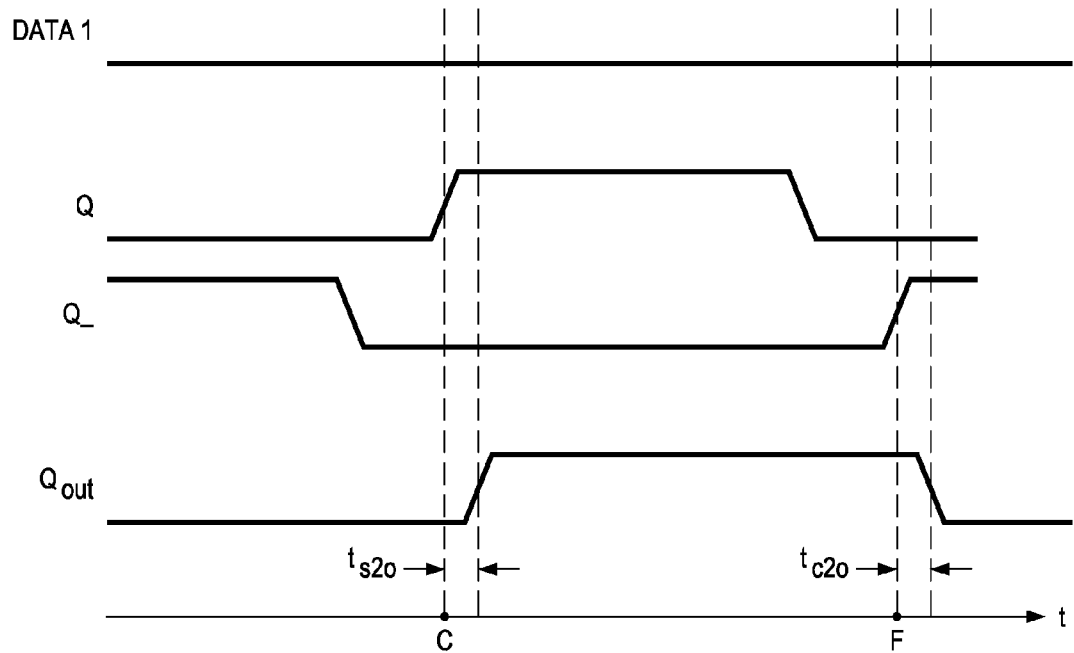
FIGS. 6A and 6B are time sequence diagrams illustrating how the restored output signals, substantially free from phase distortions, are generated.

FIG. 6A illustrates exemplary time sequences of complementary output signals Q and Q_ and the restored output signal $Q_{out}$. The data 1 stream is a constant data 1 stream providing a high voltage, which can be sampled to generate the restored output signal $Q_{out}$. In the beginning of the illustrated time sequence, output signal Q is low, and hence the restored output signal $Q_{out}$ is set to data 0 (low voltage). When the rising mid-point t(C) of output signal Q is detected by the data clipper (refer to FIG. 5), the data clipper starts to sample the data 1 stream and pass the sampled data 1 stream as the restored output signal $Q_{out}$. When the rising mid-point t(F) of the complementary output signal Q_ is detected by the data clipper, the data clipper clears the sampling of the data 1 stream, and the restored output signal $Q_{out}$ is reset back to data 0. As a result, a unit interval of signal $Q_{out}$ is "clipped" from the data 1 stream.

The period of the output signal $Q_{out}$ can be expressed as:

$$t_{per\_Qout} = (t(F) + t_{c2o}) - (t(C) + t_{s2o}) \quad [Eq.~8]$$
$$= (t(F) - t(C)) + (t_{c2o} - t_{s2o})$$

wherein $t_{s2o}$ is the time of sample to output, and $t_{c2o}$ is the time of clear to output, both being the delays of the data clipper. If $t_{c2o}$ matches $t_{s2o}$, the original phase of the input signal is fully retrieved. One skilled in the art will realize how to adjust $t_{c2o}$ to match $t_{s2o}$, for example, by adding delay elements such as transmission gates.

FIG. 6A illustrates the exemplary implementation, in which data 1 stream is clipped, and un-clipped portions of the output signal are formed by resetting the restored output signal $Q_{out}$ to data 0. Alternatively, a data 0 stream may be sampled to generate the restored output signal $Q_{out}$. However, the sampling preferably ends at time t(C), and restarts at t(F). Between time points C and F, the restored output signal $Q_{out}$ is set to data 1, which is opposite to the signal level of data 0 stream.

Figure 6B:
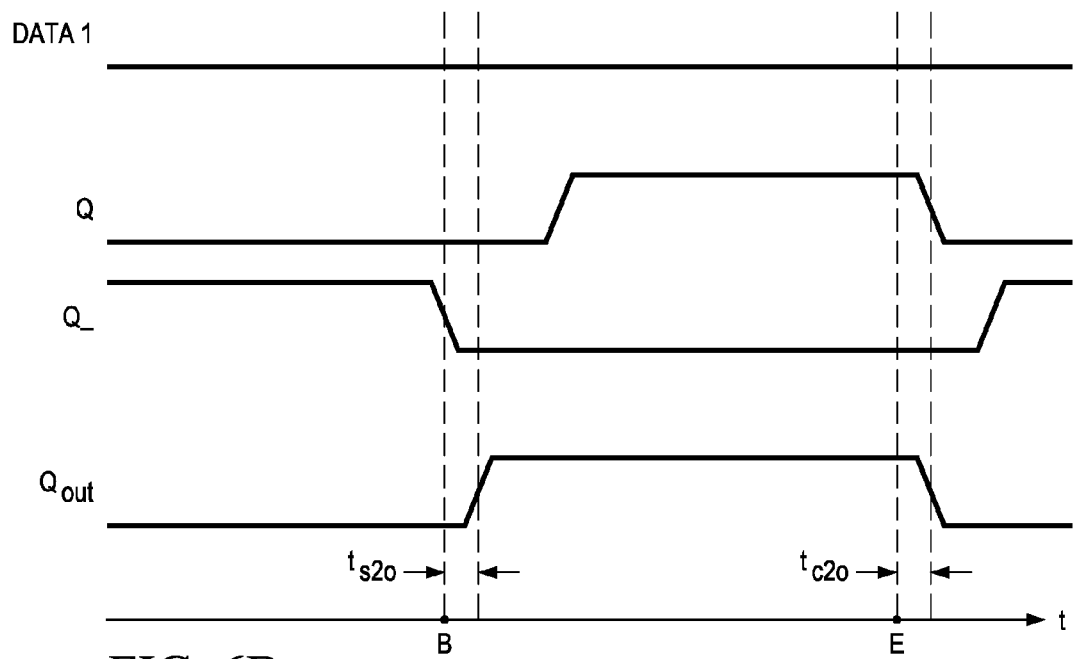

FIG. 6B illustrates an alternative embodiment. When the falling mid-point t(B) of complementary output signal Q_is detected by the clipper, the data clipper starts to sample (clip) the data 1 stream and pass the sampled data 1 stream to the restored output signal $Q_{out}$. When the falling mid-point t(E) of output signal Q is detected by the clipper, the data clipper clears the sampling of data 1 stream, and the restored output signal $Q_{out}$ is reset back to data 0.

FIG. 7 illustrates an exemplary block diagram for implementing the block diagram shown in FIG. 5. The data clipper includes a selecting circuit, which may detect the rising mid-point of output signal Q, clipping (sampling) data from a constant data 1 stream, and generating a signal $Q_{sel}$. The generated signal $Q_{sel}$ is then passed to a resetting circuit, which is for resetting signal $Q_{sel}$ back to data 0 at the rising point of the complementary output signal Q_. The constant data stream may be generated by a data stream unit, although the data stream unit may be as simple as a node having a constant voltage. The constant data stream may be a constant data 1 stream, which has high voltage level, or a constant data 0 stream, which has a low voltage level.

In alternative embodiments, as discussed in the preceding paragraphs, instead of clipping data 1 stream, data 0 stream may be clipped to generate the restored output signal $Q_{out}$. Correspondingly, as shown in FIG. 6A, the selecting circuit starts sampling data 0 at the rising mid-point of complementary output signal Q_, and the resetting circuit resets the generated $Q_{sel}$ signal back to data 1 at the rising mid-point of output signal Q. Alternatively, the functions of the selecting circuit and the resetting circuit can be modified to implement the scheme illustrated in FIG. 6B.

FIG. 8 illustrates a circuit diagram for implementing the block diagram shown in FIG. 7. The selecting circuit includes transmission gates P1, P2, P3 and P4 and inverters Inv1, inv2, inv3, inv4, and inv5. When signal Q rises from 0 to 1, the data 1 stream is selected to generate intermediate output signal $Q_{sel}$. The generated signal $Q_{sel}$ is inputted into an AND gate "and1." The resetting circuit includes transmission gate P5, inverter inv6 and the AND gate and1. When signal Q rises from 0 to 1, the output signal will be reset to 0 by AND gate and1. Transmission gate P5 is for matching time delays in the selecting circuit and resetting circuit (refer to Equation 8). The optimum time delay match may be achieved by experiments.

The embodiments of the present invention have several advantageous features. The phase distortion may be significantly reduced, and possibly substantially eliminated. The embodiments of the present invention support both data and clock duty cycle corrections, and are substantially immune to process variations.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
a detecting circuit comprising a first input and a second input, with a first signal received into the first input and a second signal received into the second input, wherein the detecting circuit is configured to detect a first edge of the first signal and a second edge of the second signal, and wherein the second edge immediately follows the first edge and is in a same direction as the first edge;
an output node;
a constant voltage node at a constant voltage; and
a signal regenerator connected to the detecting circuit and the output node, wherein the signal regenerator is configured to clip the constant voltage from the constant voltage node to generate an output signal having an additional first edge and an additional second edge, and wherein the additional first edge and the additional second edge are opposite edges substantially aligned to the first edge and the second edge, respectively, and wherein the additional first edge and the additional second edge are immediate neighboring edges.

2. The circuit of claim 1, wherein the first and the second signals are complementary signals, and wherein the first and the second edges are rising edges.

3. The circuit of claim 1, wherein the first and the second signals are complementary signals, and wherein the first and the second edges are falling edges.

4. The circuit of claim 1, wherein the signal regenerator has a first portion combined with a first sub-circuit of the detecting circuit to form a selecting circuit, and a second portion combined with a second sub-circuit of the detecting circuit to form a resetting circuit, and wherein an output of the selecting circuit is connected to a first input of the resetting circuit.

5. The circuit of claim 4, wherein at least one of the selecting circuit and the resetting circuit comprises a time delay device for matching delays in the selecting circuit and the resetting circuit.

6. The circuit of claim 4, wherein the selecting circuit comprises an input connected to the first signal, and wherein the resetting circuit further comprises a second input connected to the second signal, and an output connected to the output node.

7. The circuit of claim 6, wherein the resetting circuit is configured for passing a first portion of the constant voltage from the constant voltage node, and resetting a second portion of selected data to a signal level opposite to a signal level of the constant voltage, and wherein the selecting circuit and the resetting circuit respond to the first edge of the first signal and the second edge of the second signal.

8. A method comprising:
receiving a first signal and a second input signal at different inputs of a circuit, wherein the first and the second input signals are complementary to each other;
detecting a first edge of the first signal;
detecting a second edge of the second signal, wherein the first and the second edges are in a same direction, and wherein the second edge immediately follows the first edge; and
generating an output signal having a third and a fourth edge substantially aligned with the first and the second edges, respectively, wherein the third and the fourth edges are opposite edges immediately next to each other, wherein the step of generating the output signal comprises:
starting from the first edge, passing a constant voltage received from a constant voltage node as the output signal; and
starting from the second edge, resetting the output signal to a level opposite to the constant voltage.

9. The method of claim 8, wherein the first and the second edges are rising edges.

10. The method of claim 8, wherein the first and the second edges are falling edges.

11. The method of claim 8 further comprising delaying one of the steps of passing and resetting to match a passing delay and a resetting delay.

* * * * *